United States Patent
Romano

(10) Patent No.: US 9,397,647 B2
(45) Date of Patent: Jul. 19, 2016

(54) CLOCK SPURS REDUCTION TECHNIQUE

(71) Applicant: MARVELL WORLD TRADE LTD, St. Michael (BB)

(72) Inventor: Luca Romano, Milan (IT)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/519,671

(22) Filed: Oct. 21, 2014

(65) Prior Publication Data

US 2015/0035576 A1 Feb. 5, 2015

Related U.S. Application Data

(63) Continuation-in-part of application No. 13/839,696, filed on Mar. 15, 2013, now Pat. No. 9,000,815, which is a continuation of application No. 13/191,329, filed on Jul. 26, 2011, now Pat. No. 8,400,197.

(60) Provisional application No. 61/894,702, filed on Oct. 23, 2013, provisional application No. 61/368,459, filed on Jul. 28, 2010.

(51) Int. Cl.
*H03H 11/26* (2006.01)
*H03K 5/13* (2014.01)
*H03K 5/135* (2006.01)
*H03K 5/00* (2006.01)

(52) U.S. Cl.
CPC .............. *H03K 5/131* (2013.01); *H03K 5/133* (2013.01); *H03K 5/135* (2013.01); *H03K 2005/00058* (2013.01)

(58) Field of Classification Search
USPC ................. 327/141, 144–163; 331/15–17; 375/373–376
See application file for complete search history.

(56) References Cited

U.S. PATENT DOCUMENTS

| | | | | |
|---|---|---|---|---|
| 5,754,601 A | * | 5/1998 | Horng | H03D 3/007 329/320 |
| 6,414,627 B1 | * | 7/2002 | McEwan | G01S 13/0209 342/118 |
| 7,102,447 B2 | * | 9/2006 | Mattisson | H03B 5/04 257/275 |
| 2003/0235261 A1 | * | 12/2003 | Patana | H03M 7/3022 375/376 |
| 2004/0239389 A1 | * | 12/2004 | Matsuno | H03L 7/0812 327/158 |

(Continued)

FOREIGN PATENT DOCUMENTS

| | | |
|---|---|---|
| CN | 101404569 A | 4/2009 |
| EP | 1 428 335 B1 | 2/2007 |

(Continued)

OTHER PUBLICATIONS

Combined Office Action and Search Report issued May 6, 2015 in Chinese Patent Application No. 201180036819.8 (with English language translation and English Translation of Category of Cited Documents).

(Continued)

*Primary Examiner* — Brandon S Cole

(57) ABSTRACT

Aspects of the disclosure provide a circuit having a jittered clock generator. The jittered clock generator is configured to add jitter of a controlled characteristic to a first clock signal of a clock frequency to generate a second clock signal to be used by a transceiver for operating at a radio frequency. The jitter of the controlled characteristic adjusts a clock harmonic at the radio frequency of the transceiver.

20 Claims, 7 Drawing Sheets

(56) References Cited

U.S. PATENT DOCUMENTS

| | | | |
|---|---|---|---|
| 2006/0017487 A1 | 1/2006 | Yoneda | |
| 2006/0250095 A1* | 11/2006 | Min | H05B 41/2825 315/274 |
| 2007/0213019 A1* | 9/2007 | Devries | H04B 1/28 455/130 |
| 2007/0276891 A1 | 11/2007 | Warner et al. | |
| 2008/0136534 A1 | 6/2008 | Li | |
| 2008/0192876 A1 | 8/2008 | Dulger et al. | |
| 2009/0081984 A1* | 3/2009 | Gailus | H03L 7/1974 455/323 |
| 2009/0212835 A1* | 8/2009 | Xu | H03L 7/1974 327/156 |
| 2010/0225367 A1* | 9/2010 | Murali | H03L 7/18 327/156 |
| 2011/0156783 A1* | 6/2011 | Pavlovic | H03L 7/081 327/159 |
| 2012/0025880 A1* | 2/2012 | Romano | H03L 7/07 327/156 |

FOREIGN PATENT DOCUMENTS

| | | |
|---|---|---|
| JP | 5-152908 A | 6/1993 |
| WO | WO 01/37462 A1 | 5/2001 |
| WO | WO 02/095943 A2 | 11/2002 |

OTHER PUBLICATIONS

International Search Report and Written Opinion issued on Feb. 27, 2015 in PCT/IB2014/002450.

Tian Xia et al., "Delay Chain Based Programmable Jitter Generator", ETS 2004, Proceedings of Ninth IEEE European Test Symposium, XP010733285, May 23, 2004, pp. 16-21.

* cited by examiner

US 9,397,647 B2

CLOCK SPURS REDUCTION TECHNIQUE

CROSS REFERENCE TO RELATED APPLICATIONS

This present disclosure claims the benefit of U.S. Provisional Application No. 61/894,702, "Clock Spurs Reduction Technique" filed on Oct. 23, 2013, and is a continuation-in-part of U.S. patent application Ser. No. 13/839,696, "Fractional Spur Reduction Using Controlled Clock Jitter" filed on Mar. 15, 2013, which is a continuation of U.S. patent application Ser. No. 13/191,329, "Fractional Spur Reduction using Controlled Clock Jitter" filed on Jul. 26, 2011 and issued as U.S. Pat. No. 8,400,197 on Mar. 19, 2013, which in turn claims the benefit of U.S. Provisional Application No. 61/368,459, entitled "A PLL Fractional Spurs Reduction" filed on Jul. 28, 2010. The entire disclosures of the prior applications are hereby incorporated by reference herein in their entirety.

BACKGROUND

Generally, radio frequency (RF) circuits operate based on a reference clock signal. In an example, a clock generator generates a reference clock signal of a relatively low frequency, such as in the order of 20 MHz, and provides the reference clock signal to a transceiver that transmits/receives radio frequency signal. The transceiver includes a phase locked loop that generates an RF carrier signal of much higher frequency, such as in the order of 1 GHz and the like, based on the reference clock signal.

SUMMARY

Aspects of the disclosure provide a circuit having a jittered clock generator. The jittered clock generator is configured to add jitter of a controlled characteristic to a first clock signal of a clock frequency to generate a second clock signal to be used by a transceiver for operating at a radio frequency. The jitter of the controlled characteristic adjusts a clock harmonic at the radio frequency of the transceiver.

In an embodiment, the jittered clock generator includes a jitter controller and a jitter generator. The jitter controller is configured to generate a control signal as a function of the clock harmonic. The jitter generator is configured to add the jitter according to the control signal to the first clock signal to generate the second clock signal. In an example, the jitter generator is configured to add a variable delay to the first clock signal to generate the second clock signal. For example, the jitter generator includes a delay chain of a plurality of delay elements to add an additional amount of delay to the first clock signal. Further, the jitter generator includes an edge selector configured to vary a selection of one of the delay elements to output the second clock in order to change the variable delay of the second clock signal to the first clock signal. The jitter controller is configured to generate a sequence of selection codes to control the edge selector to vary the selection of the delay elements. In an example, the jitter controller is configured to generate the sequence of the selection codes to vary the selection of the delay elements in a random manner. In an embodiment, the jitter generator is configured to form a loop that includes the delay chain to calibrate the additional amount of delay added by each delay element to suppress the clock harmonic.

According to an aspect of the disclosure, the jittered clock generator is configured to add the jitter of the controlled characteristic to convert a power at the clock harmonic to spurs out of the radio frequency band of interest. According to another aspect of the disclosure, the jittered clock generator is configured to add the jitter of the controlled characteristic to convert a power at the clock harmonic to a large number of frequency components having low power. In an example, the power of the clock harmonic is converted to a noise floor.

Aspects of the disclosure provide a method. The method includes receiving a first clock signal of a clock frequency and adding jitter of a controlled characteristic to the first clock signal to generate a second clock signal to be used by a transceiver for operating at a radio frequency. The jitter of the controlled characteristic adjusts a clock harmonic at the radio frequency of the transceiver.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
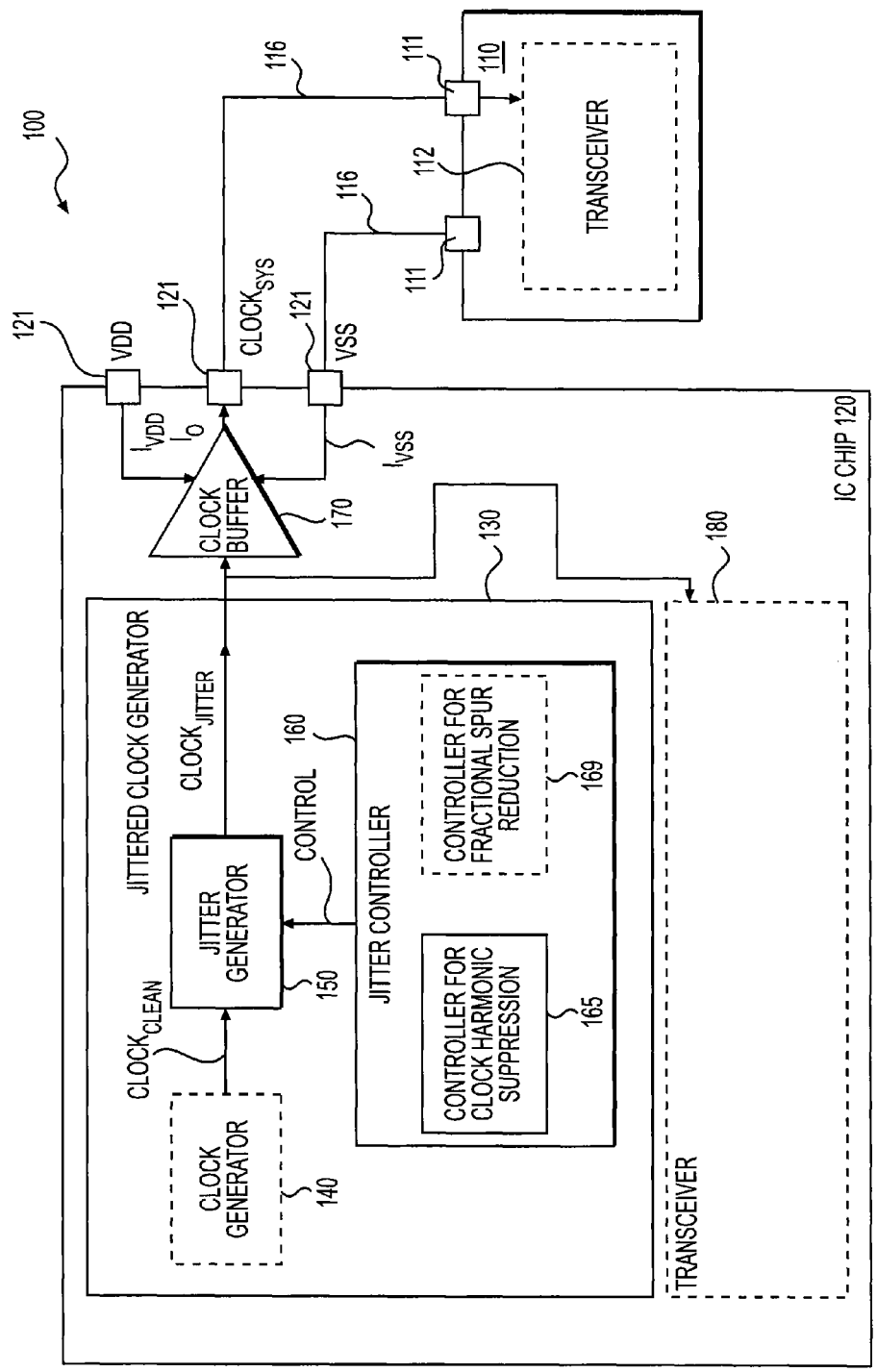
FIG. 1 shows a block diagram of an electronic device example 100 according to an embodiment of the disclosure.

FIG. 1 shows a block diagram of an electronic device example 100 according to an embodiment of the disclosure. The electronic device 100 includes a jittered clock generator 130 configured to add jitter of a controlled characteristic to a first clock signal of a clock frequency to generate a second clock signal to be used by a transceiver. The jitter of the controlled characteristic reduces a specific harmonic of the clock frequency at the transceiver.

The electronic device 100 can be any suitable device, such as a desktop computer, a laptop computer, a tablet computer, a smart phone, an access point, and the like that includes a transmitting circuit and/or a receiving circuit that operate based on a reference clock signal.

According to an aspect of the disclosure, the jittered clock generator 130 is configured to generate a reference clock signal $CLOCK_{SYS}$ having a controlled jitter characteristic and provide the reference clock signal $CLOCK_{SYS}$ to circuits that require a reference clock signal, such as a transceiver 180 on a same IC chip 120 as the jittered clock generator 130, a transceiver 112 on another IC chip 110, and the like.

Specifically, in the FIG. 1 example, the jittered clock generator 130 includes a jitter generator 150 and a jitter controller 160 coupled together as shown in FIG. 1. The jitter controller 160 provides control signals indicative a jitter characteristic. According to the control signals, the jitter generator 150 adds jitter to a first clock signal ($CLOCK_{CLEAN}$) to generate a second clock signal ($CLOCK_{JITTER}$) having the jitter characteristic. The second clock signal $CLOCK_{JITTER}$ is buffered and output as the reference clock signal $CLOCK_{SYS}$.

According to an aspect of the disclosure, the first clock signal $CLOCK_{CLEAN}$ has a precise frequency $F_C$ and little jitter and can be considered as a clean clock. In an example, the first clock signal $CLOCK_{CLEAN}$ is generated by a clock generator 140 on the same IC chip 120. In another example, the first clock signal $CLOCK_{CLEAN}$ is generated by a crystal oscillator external to the IC chip 120, and is input to the IC chip 120 and received by the jitter generator 150.

The jitter generator 150 is configured to add jitter to the first clock signal $CLOCK_{CLEAN}$, in an embodiment, the jitter generator 150 is configured to delay transition edges, such as rising edges and/or falling edges, of the first clock signal according to the control signals from the jitter controller 160.

In an embodiment, the jitter generator 150 includes a delay chain of multiple delay stages. In an example, the delay stages can be calibrated to have specific delays. The delay chain is configured to delay transition edges, and output delayed transitions from the multiple delay stages. The outputs from the multiple delay stages are selected to output transitions in the second clock signal $CLOCK_{JITTER}$. In an example, to output a transition in the second clock signal $CLOCK_{JITTER}$, one of the outputs from the multiple delay stages is selected.

The jitter controller 160 is configured to determine the control signals to control the jitter generator 150 to generate and add jitter in the first clock signal $CLOCK_{CLEAN}$. The jitter controller 160 can use any suitable algorithm to generate the control signals. In an example, the jitter controller 160 includes a controller 165 configured to generate the control signals for adding jitter to suppress clock harmonic that can deteriorate transceiver performance.

It is noted that the jitter controller 160 can include other suitable controller to generate the control signals to add jitter for other purpose. For example, the jitter controller 160 can include a controller 169 for fractional spur reduction. The jitter controller 160 can be implemented using various techniques, such as circuits, instructions executed by a processor, and the like.

According to an aspect of the disclosure, clock signals can impair radio frequency (RF) transceiver performance through various interference mechanisms. In an embodiment, clock signals cause current pulses. In an example, clock signals are generally buffered, such as by a clock buffer 170 and the like, and are provided to digital circuits to synchronize operations of the digital circuits. The clock signals can cause current pulses flowing through buffers, supplies, grounds and the digital circuits at the time of clock transitions. The current pulses can cause electromagnetic emission of high order harmonics. Further, the current pulses can cause supply noise (e.g., high frequency voltage ripple), in power supply, such as in a voltage supply (VDD), in a ground supply (VSS), and the like. The electromagnetic emission and the supply noise can deteriorate performance of a transceiver 180 on the IC chip 120.

In an example, when the high order harmonics and/or the supply noise is in the RF band of a receiving circuit in the transceiver 180, the high order harmonics and/or the supply noise interferes the performance of the receiving circuit. In another example, the high order harmonics and/or the supply noise can be directly coupled to a transmitting circuit in the transceiver 180. The harmonics and/or the supply noise can cause violation of the spectral emission mask.

In another example, the clock signals on the IC chip 120 can also deteriorate performance of the transceiver 112 on the other IC chip 110. For example, the reference clock signal $CLOCK_{SYS}$ on the IC chip 120 is a system clock and is provided to other IC chips, such as the IC chip 110, to be used by other IC chips. In the FIG. 1 example, the IC chip 120 provides the reference clock signal $CLOCK_{SYS}$ to the IC chip 110 via various conductive components, such as bond pads 121 and 111, bond wire 116, printed copper lines (not shown), vias (not shown) and the like. Further, in an example, the power supply VDD and the ground supply VSS of the IC chip 120 and the IC chip 110 can be coupled together via conductive components. The driving current $I_O$ and the supply current $I_{VDD}$ are pulse current, and can cause electromagnetic emission of clock harmonics to impair performance of the transceiver 112 on the IC chip 110. Further, supply noise in the power supply VDD and the ground supply VSS on the IC chip 120 can be coupled to the IC chip 110 to impair the performance of the transceiver 112.

According to an aspect of the disclosure, jitter characteristic of the reference clock signal $CLOCK_{SYS}$ is suitably controlled to cause one or more specific high-order harmonics of the clock frequency $F_C$ to be attenuated or eliminated. In an example, when a high-order harmonic of the clock frequency is in an RF band of a receiving circuit, jitter characteristic of the reference clock signal $CLOCK_{SYS}$ is controlled to attenuate or eliminate the high-order harmonic. In an example, the jitter of reference clock signal $CLOCK_{SYS}$ causes spurs at other frequencies that are outside of the RF band of the receiving circuit, and can be suitably filtered out.

According to another aspect of the disclosure, jitter characteristic of the reference clock signal $CLOCK_{SYS}$ is suitably controlled to cause the specific high-order harmonics to be converted to a noise floor to reduce the spectral emission per unit bandwidth in order to satisfy the spectral emission mask requirement.

Figure 2:
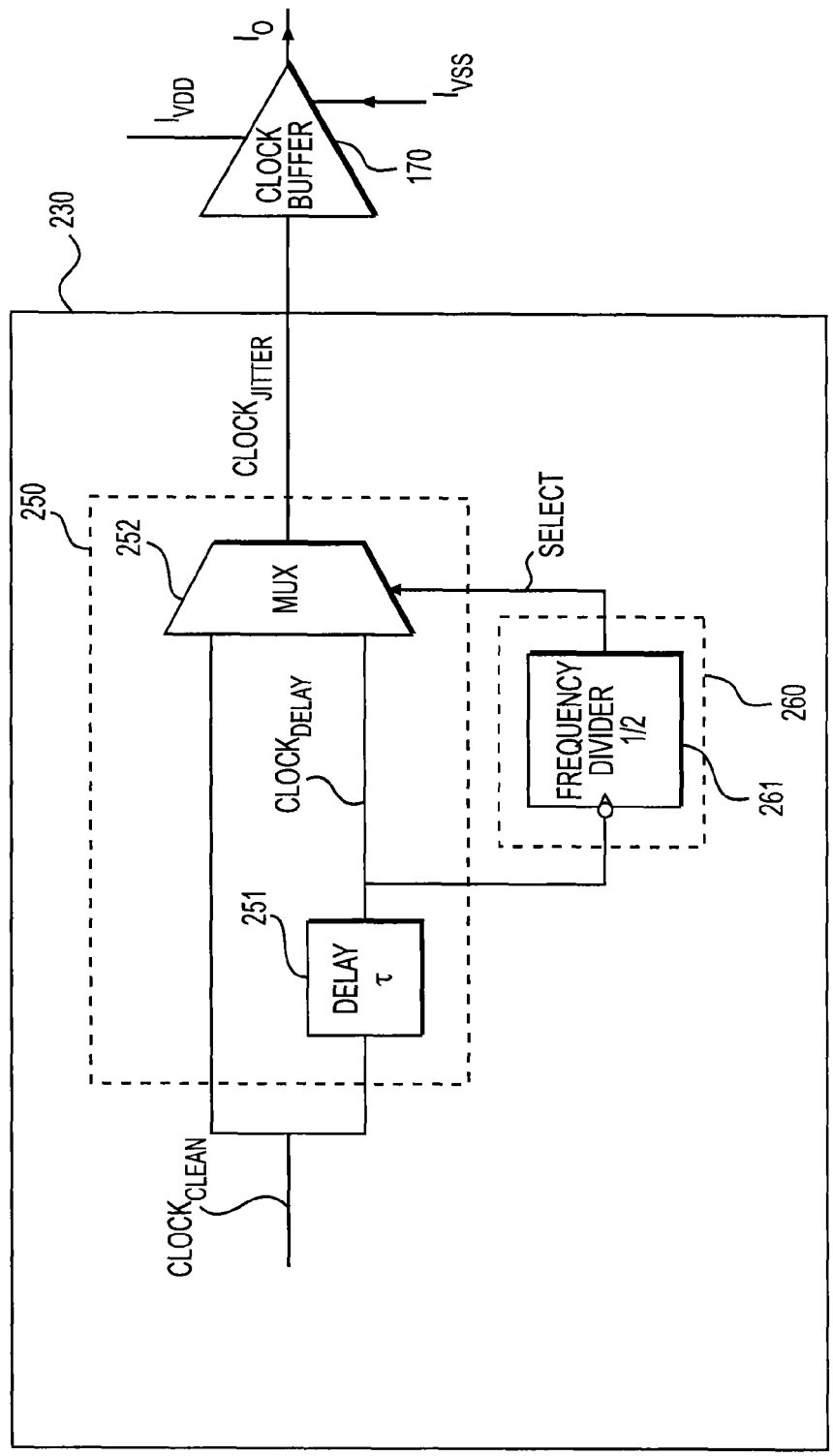
FIG. 2 shows a block diagram of a jittered clock generator example 230 according to an embodiment of the disclosure.

FIG. 2 shows a block diagram of a jittered clock generator example 230 according to an embodiment of the disclosure. In an example, the jittered clock generator 230 can be used in the electronic device 100 as the jittered clock generator 130. The jittered clock generator 230 receives a first clock signal $CLOCK_{CLEAN}$, adds jitter of a controlled characteristic and outputs a second clock signal $CLOCK_{JITTER}$ having the jitter of the controlled characteristic.

The jittered clock generator 230 includes a jitter generator 250 and a jitter controller 260 coupled together as shown in FIG. 2. The jitter generator 250 includes a delay module 251 configured to delay the first clock signal $CLOCK_{CLEAN}$ by a delay timer to generate a delayed first clock signal $CLOCK_{DELAY}$, and a multiplexer 252 configured to select one of the first clock signal $CLOCK_{CLEAN}$ and the delayed first clock signal $CLOCK_{DELAY}$ based on a control signal SELECT from the jitter controller 260.

The jitter controller 260 can use any suitable technique to generate the control signal SELECT. In an embodiment, the jitter controller 260 includes a frequency divider 261 to frequency-divide the delayed first clock signal $CLOCK_{DELAY}$ to generate the control signal SELECT. In an example, the frequency divider 261 is implemented using a flip-flop that frequency-divides the delayed first clock signal $CLOCK_{DELAY}$ by two to generate the control signal SELECT. Then, the control signal SELECT controls the jitter generator 250 to add delays to clock transitions every other clock cycle to introduce jitter in the second clock signal $CLOCK_{JITTER}$. The second clock signal $CLOCK_{JITTER}$ is buffered by a clock buffer 170. The clock buffer 170 drives the second clock signal $CLOCK_{JITTER}$ to other circuits, such as digital circuits, off-chip circuits, and the like. The jitter in the second clock signal $CLOCK_{JITTER}$ attenuates or eliminates specific harmonic of the clock frequency.

Generally, circuits that operate based on a clock signal introduce noise in circuit current, such as a supply current $I_{VDD}$ from a power supply VDD, a ground current $I_{VSS}$ injected into a ground supply VSS, an output current $I_O$ from a buffer, and the like. In general, the noise current can be described as a train of pulses, aligned with the clock transitions, such as rising edges and falling edges of the clock signal.

Figure 3:
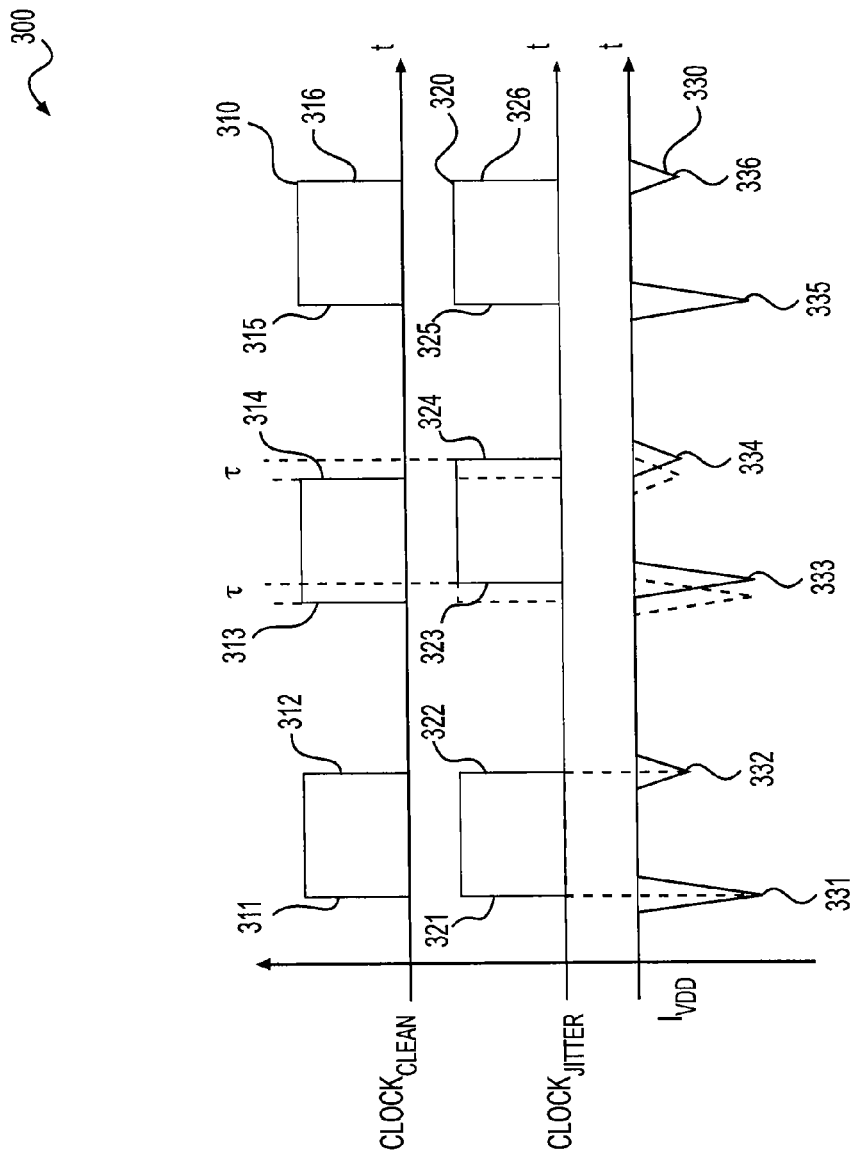
FIG. 3 shows a plot 300 of waveforms according to an embodiment of the disclosure.

FIG. 3 shows a plot 300 of waveforms according to the jittered clock generator 230 in FIG. 2. The plot 300 includes a first waveform 310 for the first clock signal $CLOCK_{CLEAN}$, a second waveform 320 for the second clock signal $CLOCK_{JITTER}$, and a third waveform 330 for the supply current $I_{VDD}$.

In the FIG. 3 example, the first clock signal $CLOCK_{CLEAN}$ is a clean clock signal with a relatively precise clock frequency $F_C$ as shown by the first waveform 310. The second clock signal $CLOCK_{JITTER}$ has jitter with a controlled characteristic. Specifically, a delay time is added to clock transitions every other clock cycle to introduce jitter in the second clock signal $CLOCK_{JITTER}$, as shown by 323 and 324. The second clock signal $CLOCK_{JITTER}$ is provided to circuits, such as the clock buffer 170, and the like. The supply current $I_{VDD}$ has current pulse in response to the clock transitions of the second clock signal $CLOCK_{JITTER}$, as shown by 331-336.

It is noted that the current pulse may have different shapes in response to rising edges and falling edges. The current pulses cause a high order harmonic in a RF band of a transceiver, and may deteriorate the transceiver performance.

In an embodiment, to suppress an N-th order harmonic of the clock frequency $F_C$ (N is a positive integer), the delay time τ is determined according to Eq. 1:

$$\tau = (2k+1) \times \frac{1}{2NF_C} \qquad \text{Eq. 1}$$

where k denotes a whole number. In this embodiment, due to the added jitter, the N-th order harmonic of the clock frequency $F_C$ is suppressed, however two spurs appear at $$N \times F_C \pm \frac{F_C}{2}$$

in the frequency spectrum. In an example, the two spurs are outside a channel band of the transceiver and do not affect the transceiver performance. For example, the clock frequency $F_C$ is 26 MHz, and the transceiver operates at an RF frequency of 1.846 GHz, which is the 71th order harmonic of the clock frequency. When jitter is added according to FIG. 2 and Eq. 1 to suppress the 71th order harmonic, two spurs appear at 13 MHz from the RF frequency. In an example, the RF channel bandwidth is smaller than 13 MHz, thus the two spurs are outside of the channel band and do not affect the performance of the transceiver.

Further, according to an aspect of the disclosure, the level of harmonic suppression and the amplitude of the two spurs are related to the delay time τ, and the value of k can be chosen arbitrarily, e.g., to have a delay time τ suitable for circuit implementation.

Figure 4:
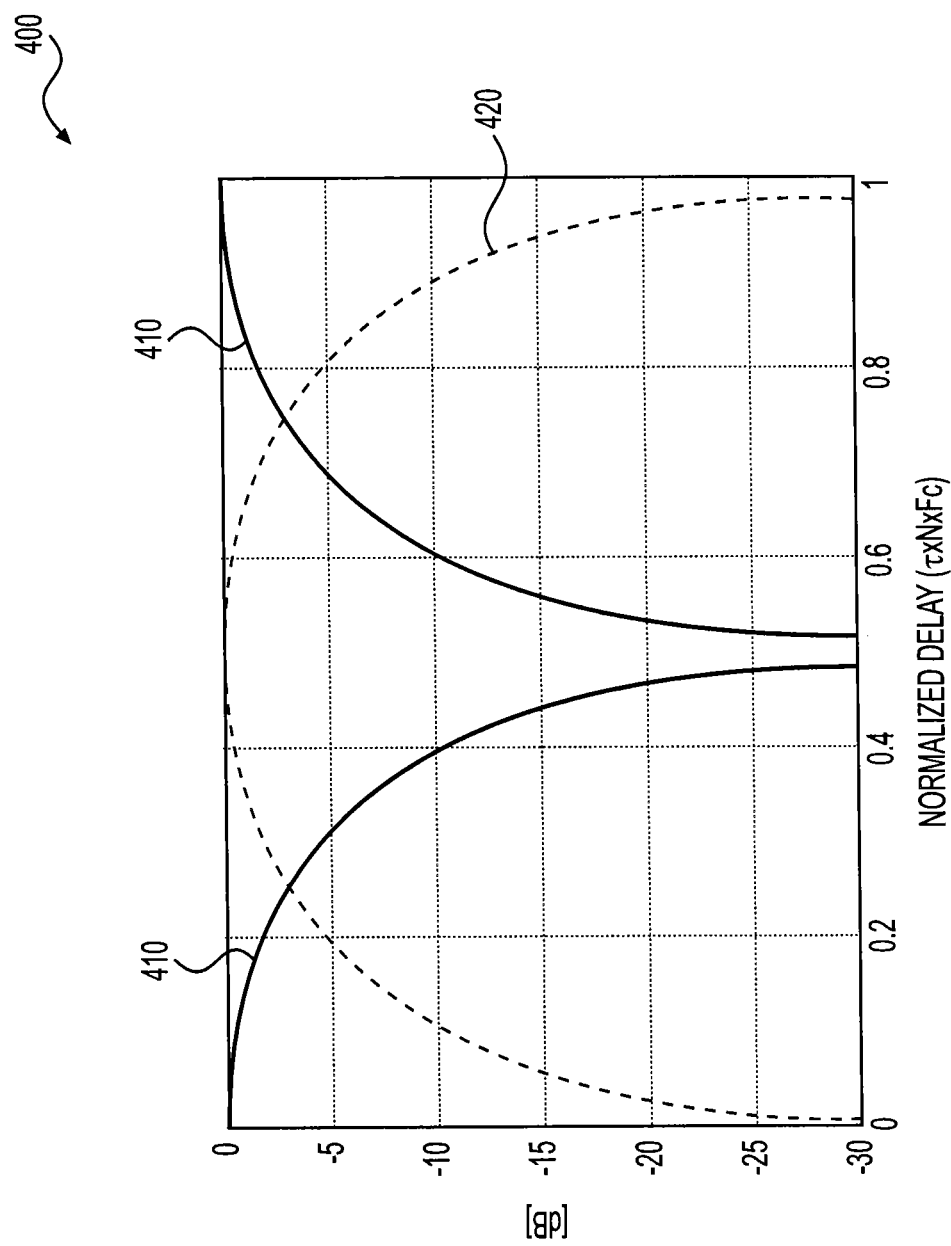
FIG. 4 shows a plot 400 illustrating harmonic suppression according to an embodiment of the disclosure.

FIG. 4 shows a plot 400 illustrating the relationships of harmonic suppression and the amplitude of the spurs to the delay time according to an embodiment of the disclosure. In the plot 400, the X-axis denotes normalized delay (τ×N× F⊥C) and the Y-axis denotes the level of harmonic suppression and the amplitude of the spurs. The plot 400 includes a first curve 410 and a second curve 420. The first curve 410 shows a relationship of harmonic suppression to the normalized delay. The second curve 420 shows a relationship of spur amplitude to the normalized delay. It is noted that when the normalized delay is about 0.5, the jittered clock achieves a maximum harmonic suppression.

Figure 5:
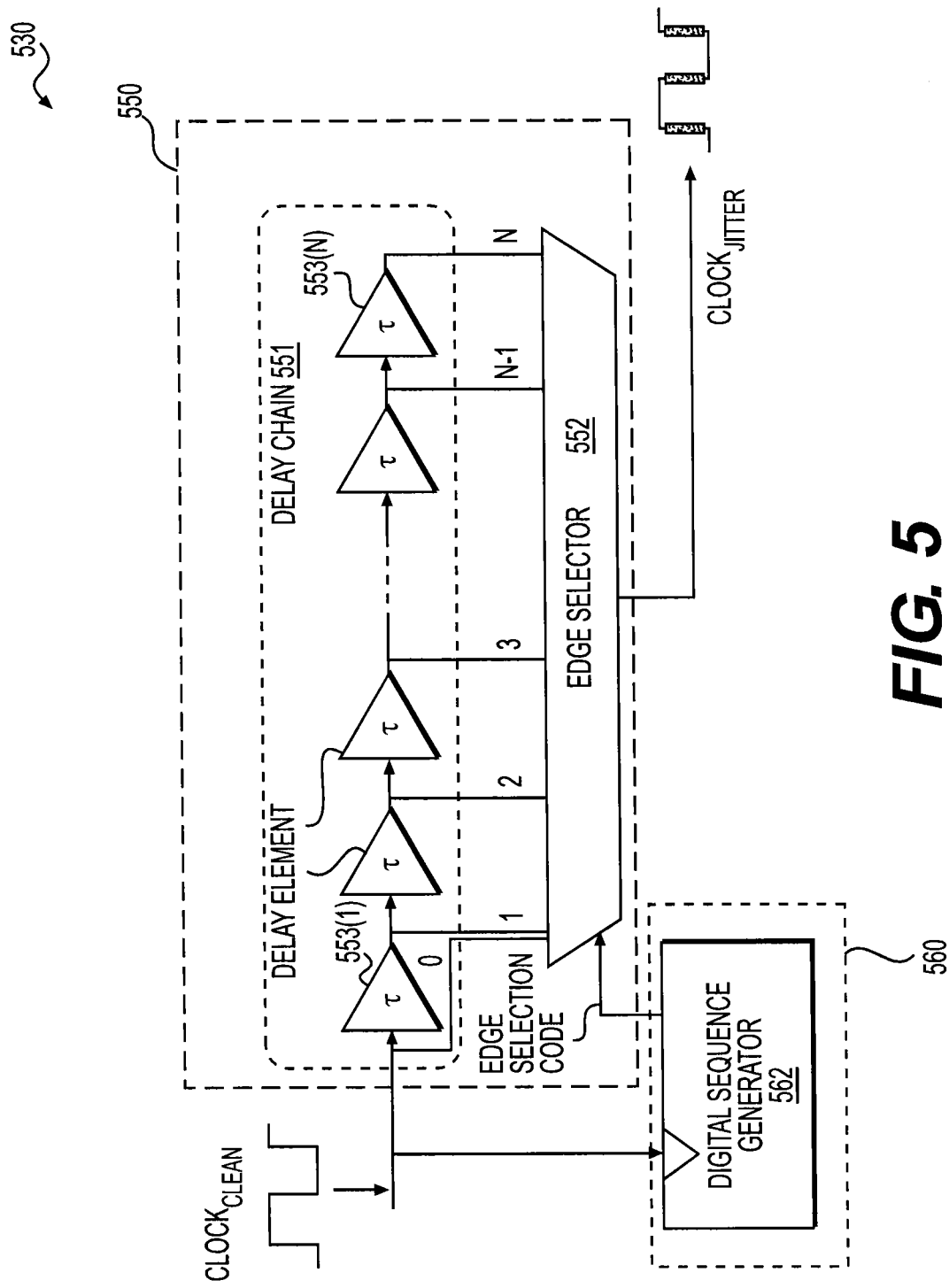
FIG. 5 shows a block diagram of another jittered clock generator example 530 according to an embodiment of the disclosure.

FIG. 5 shows a block diagram of another jittered clock generator example 530 according to an embodiment of the disclosure. In an example, the jittered clock generator 530 is used in the electronic device 100 as the jittered clock generator 130. The jittered clock generator 530 includes a jitter generator 550 and a jitter controller 560. The jittered clock generator 530 receives a first clock signal $CLOCK_{CLEAN}$, adds jitter of a controlled characteristic and outputs a second clock signal $CLOCK_{JITTER}$ having the jitter of the controlled characteristic.

In the FIG. 5 example, the jitter generator 550 includes a delay chain 551, an edge selector 552. The jitter controller 560 is implemented using a digital sequence generator 562. These elements are coupled together as shown in FIG. 5.

According to an aspect of the disclosure, the first clock signal $CLOCK_{CLEAN}$ has a precise frequency $F_C$ and little jitter and can be considered as a clean clock. In an example, the first clock signal $CLOCK_{CLEAN}$ is generated by a crystal oscillator.

The jitter generator 550 receives the first clock signal $CLOCK_{CLEAN}$, and input the first clock signal $CLOCK_{CLEAN}$ to the delay chain 551. The delay chain 551 includes a plurality of delay stages 553(1)-553(N). In an example, each delay stage is configured to delay a received signal by a delay time τ. The delay chain 551 generates a set of delayed replicas of the first clock signal $CLOCK_{CLEAN}$.

The edge selector 552 receives the first clock signal $CLOCK_{CLEAN}$ and the delayed replicas of the first clock signal $CLOCK_{CLEAN}$, selects one of the received signals according to control signals from the jitter controller 560, and outputs the selected signal as the second clock signal $CLOCK_{JITTER}$. In an embodiment, the edge selection code is updated once every clock period $1/F_C$. Timing may be provided to guarantee a glitch-free output of the second clock signal $CLOCK_{JITTER}$.

The digital sequence generator 562 generates a sequence of edge selection codes to control the jitter generator 550 to introduce the desired amount of jitter onto the first clock signal $CLOCK_{CLEAN}$ with the desired spectral characteristics. In an example, the digital sequence generator 562 is clocked at the clock frequency $F_C$ to update the edge selection code once every clock period to select a different delayed replica. The selection of different delayed replicas of the first clock $CLOCK_{CLEAN}$ introduces jitter on the second clock signal $CLOCK_{JITTER}$ output by the edge selector 552.

The digital sequence generator 562 can be implemented using various techniques. In an example, the digital sequence generator 562 is implemented as a programmable sequence generator using shift register/look-up table, and is used to introduce jitter of a characteristic, such as a sinusoidal modulation characteristic, a square wave modulation characteristic, a triangular wave modulation characteristic, and the like. In another example, the digital sequence generator 562 is implemented using a sigma-delta digital modulator. In another example, the digital sequence generator 562 is implemented as a pseudo-random sequence generator using shift registers.

In an example, the digital sequence generator 562 is configured to generate a pseudo-random pattern as the edge selection codes to introduce time jitter in a random manner to convert a clock harmonic to noise floor. For example, the clock frequency $F_C$ is 26 MHz, and a transceiver operates at an RF frequency of 1.846 GHz, which is the 71th order harmonic of the clock frequency. Further, the unit delay $\tau$ is configured to be $1/(71 \times F_C)$, about 271 ps to cancel harmonic suppression. In an example, the pseudo-random pattern repeats a sequence of 100 samples. Each sample is randomly selected from (0 and 1) to control the jitter generator 550 to add no delay or add a unit delay to transitions in a clock cycle. In this example, the clock harmonic at 1.846 GHz is converted to 100 equally spaced spurious tones between 1.846 GHz−13 MHz and 1.846 GHz+13 MHz. The power sum of the tones is about the same as the power of the original clock harmonic, and the average power of the tones is about 20 dB less than the original clock harmonic. Thus, when the number of samples is large, such as larger than one hundred and the like, the average power per tone is relatively low, and spurious tones can be considered as a white noise floor in an example.

Figure 6:
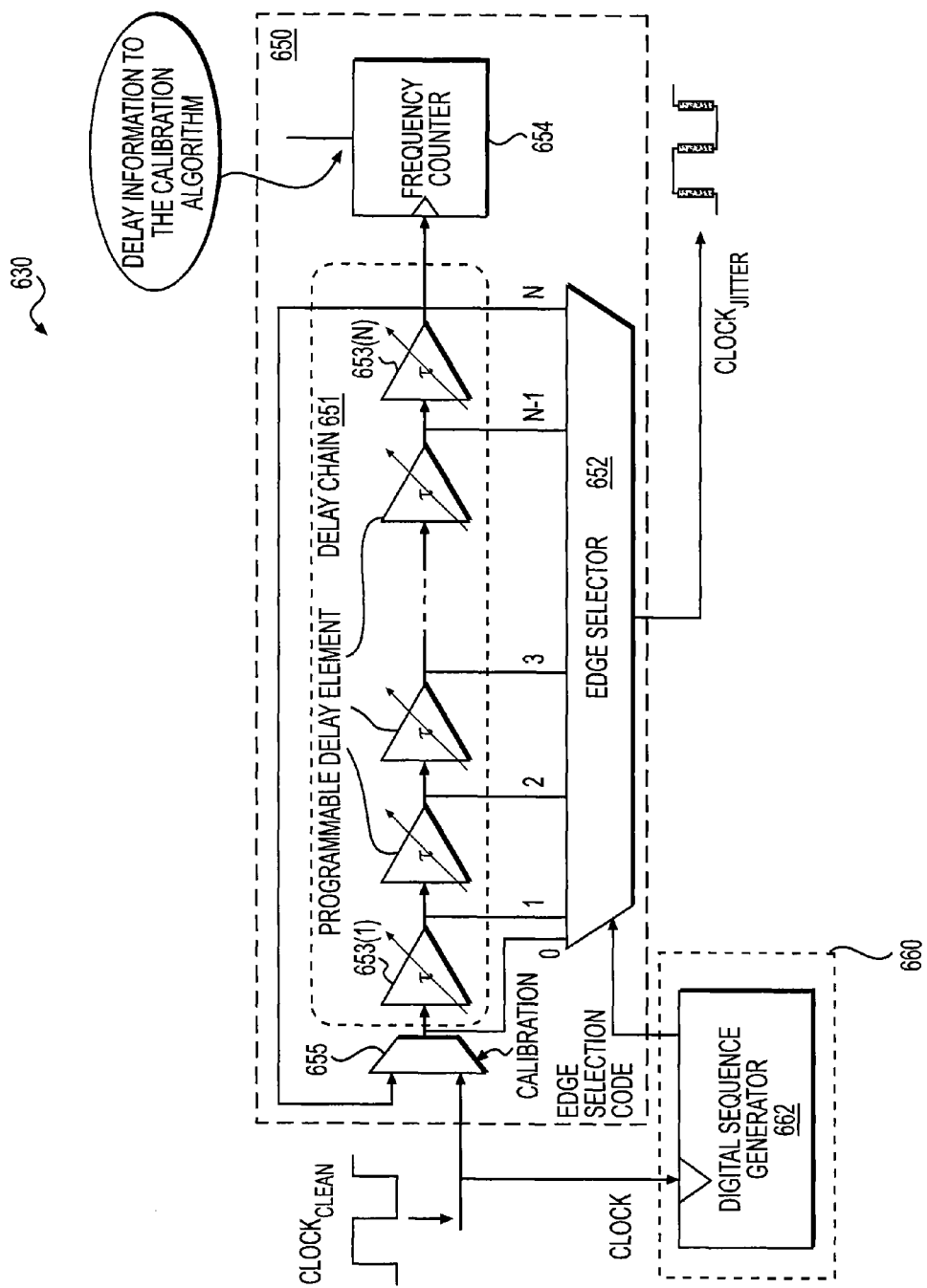
FIG. 6 shows a block diagram of a jittered clock generator example 630 for calibration according to an embodiment of the disclosure.

FIG. 6 shows a block diagram of a jittered clock generator example 630 for calibration according to an embodiment of the disclosure. The jittered clock generator 630 has a calibration mode and a jitter generation mode. In the jitter generation mode, the jittered clock generator 630 operates similarly to the jittered clock generator 530 described above. The jittered clock generator 630 also utilizes certain components that are identical or equivalent to those used in the jittered clock generator 530; the description of these components has been provided above and will be omitted here for clarity purposes. However, in this embodiment, the delay elements in the jittered clock generator 630 are programmable and can be calibrated to have a specific delay for clock harmonic suppression.

In an embodiment, the jitter generator 650 includes an odd number of programmable delay elements 653(1)-653(N) where N is an odd number. Further, the jitter generator 650 includes a multiplexer 655, the edge selector 652 and a frequency counter 654. The programmable delay elements 653(1)-653(N) form a delay chain. In an example, each programmable delay element is an inverter with a unit delay being adjustable. For example, the delay of the inverter is a function of the supply voltage of the inverter, the load capacitance, and the like. Thus, the supply voltage of the inverter or the load capacitance can be adjusted to adjust the delay of the inverter. The multiplexer 655 receives the first clock signal $CLOCK_{CLEAN}$ and a feedback output of the delay chain and selects one of them as the input to the delay chain based on a calibration control signal CALIBRATION.

The jitter generator 650 enters the calibration mode or the jitter generation mode based on the calibration control signal CALIBRATION to the multiplexer 655. For example, when the calibration control signal CALIBRATION is indicative of the calibration mode, the multiplexer 655 selects the output of the delay chain to input to the delay chain. Due to the odd number of inverters, the delay chain forms a ring oscillator. The frequency counter 654 counts the frequency of the ring oscillator. The frequency of the ring oscillator is indicative of a unit delay of each of the inverters. The delay information is provided to a calibration algorithm to adjust the unit delay value. For example, the jitter controller 660 includes a processor executing the calibration algorithm to adjust the unit delay of the inverters.

When the calibration signal is indicative of the jitter generation mode, the multiplexer 655 selects the first clock signal $CLOCK_{CLEAN}$ to input to the delay chain. Then, the jittered clock generator 630 operates similarly to the jittered clock generator 530.

Figure 7:
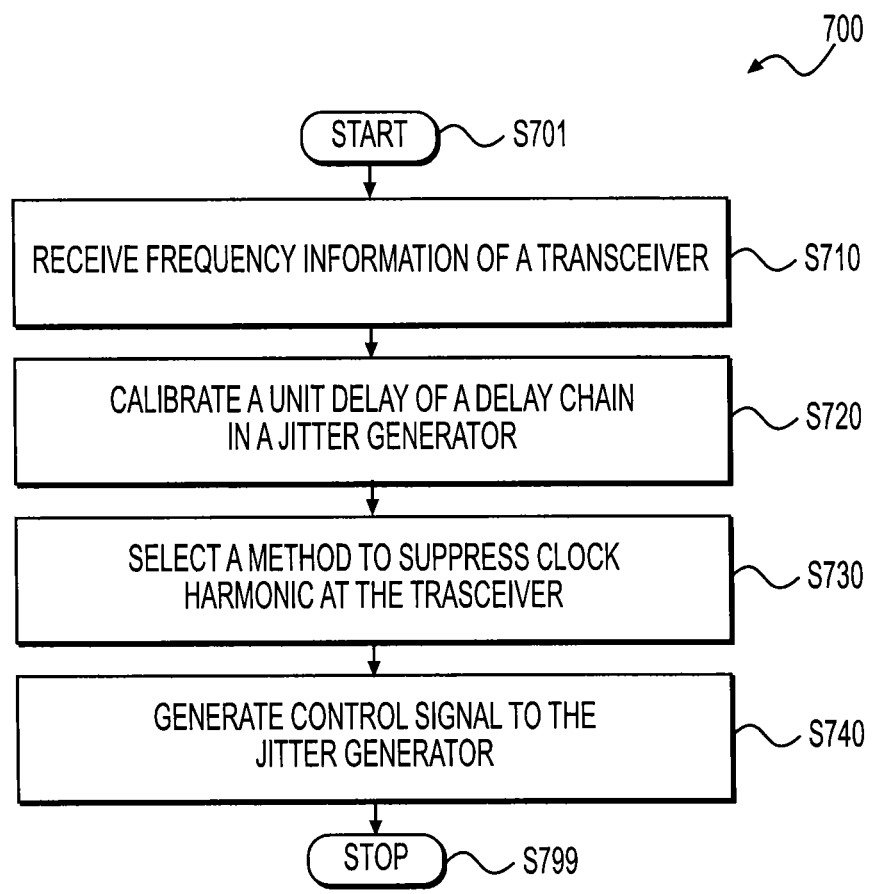
FIG. 7 shows a flow chart outlining a process example 700 according to an embodiment of the disclosure.

FIG. 7 shows a flow chart outlining a process example 700 according to an embodiment of the disclosure. In an example, the process 700 is executed in a jittered clock generator, such as the jittered clock generator 130, the jittered clock generator 230, the jittered clock generator 530, the jittered clock generator 630, and the like. The process starts at S701, and proceeds to S710.

At S710, frequency information of a transceiver is received. For example, the transceiver is in an electronic device that operates based on a system clock having a clock frequency $F_C$, such as 26 MHz. Based on the system clock, the transceiver operates at an RF frequency, such as 1.846 GHz, which is the 71th order harmonic of the clock frequency $F_C$.

At S720, a unit delay of a delay chain is calibration. In the FIG. 6 example, the jitter generator 630 enters a calibration mode. In the calibration mode, the programmable delay elements 653 are adjusted to achieve a specific unit delay. For example, the unit delay $\tau$ of each of the delay elements 653 is suitably adjusted to be $1/(71 \times F_C)$, about 271 ps.

At S730, a method to suppress clock harmonic at the transceiver is selected. In an example, a clock harmonic is about the same as a RF carrier frequency used by a receiving circuit, and may impair the receiving circuit performance. Thus, in the example, a jitter controller, such as the jitter controller 160, and the like selects a method that adds jitter to convert the power at the clock harmonic to spurs out of the RF frequency band of interest of the receiving circuit. In another example, the clock harmonic causes violation of spectral emission mask and may impair a transmitting circuit performance. The jitter controller selects a method that adds jitter to convert the power at the clock harmonic to a large number of spurs, such as larger than 100 spurs, and the like. Thus, the power at the clock harmonic is converted to noise floor.

At S740, a control signal is generated and provided to a jitter generator to introduce jitter. In an example, according to the selected method, the jitter controller 560 generates control signals, such as a sequence of edge selection codes, and the like. The edge selection codes are sequentially provided to the jitter generator 550. The jitter generator 550 receives the first clock signal $CLOCK_{CLEAN}$, generates a set of delayed replicas of the first clock signal $CLOCK_{CLEAN}$, selects one of the received signals based on the edge selection codes, and outputs the second clock signal $CLOCK_{JITTER}$ having jitter of the controlled characteristic. Then, the process proceeds to S799 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit comprising:
   a jittered clock generator configured to add jitter of a controlled characteristic to a first clock signal of a clock frequency to generate a second clock signal to be used by a transceiver for operating at a radio frequency, the jitter of the controlled characteristic adjusting a clock harmonic at the radio frequency of the transceiver to suppress an N-th order harmonic of the clock frequency while spurs caused by the added jitter occur only outside a channel band of the transceiver, wherein the N is an integer number, suppressing the N-th order harmonic of the clock frequency by adding a variable delay to the first clock signal, the variable delay being inversely proportional to a product of N and the clock frequency.

2. The circuit of claim 1, wherein the jittered clock generator further comprises:
   a jitter controller configured to generate a control signal as a function of a specific clock harmonic; and
   a jitter generator configured to add the jitter according to the control signal to the first clock signal to generate the second clock signal.

3. The circuit of claim 2, wherein the jitter generator is configured to add the variable delay to the first clock signal to generate the second clock signal.

4. The circuit of claim 2, wherein the jitter generator comprises a delay chain of a plurality of delay elements to add an additional amount of delay to the first clock signal.

5. The circuit of claim 4, wherein the jitter generator comprises an edge selector configured to vary a selection of one of the delay elements to output the second clock in order to change the variable delay of the second clock signal to the first clock signal.

6. The circuit of claim 5, wherein the jitter controller is configured to generate a sequence of selection codes to control the edge selector to vary the selection of the delay elements.

7. The circuit of claim 6, wherein the jitter controller is configured to generate the sequence of the selection codes to vary the selection of the delay elements in a random manner.

8. The circuit of claim 4, wherein the jitter generator is configured to form a loop that includes the delay chain to calibrate the additional amount of delay added by each delay element to suppress the clock harmonic.

9. The circuit of claim 1, wherein the jittered clock generator is configured to add the jitter of the controlled characteristic to convert a power at the clock harmonic to the spurs.

10. The circuit of claim 1, wherein the jittered clock generator is configured to add the jitter of the controlled characteristic to convert a power at the clock harmonic to a noise floor.

11. A method comprising:
   receiving a first clock signal of a clock frequency; and
   adding jitter of a controlled characteristic to the first clock signal to generate a second clock signal to be used by a transceiver for operating at a radio frequency, the jitter of the controlled characteristic adjusting a clock harmonic at the radio frequency of the transceiver to suppress an N-th order harmonic of the clock frequency while spurs caused by the added jitter occur only outside a channel band of the transceiver, wherein the N is an integer number, suppressing the N-th order harmonic of the clock frequency by adding a variable delay to the first clock signal, the variable delay being inversely proportional to a product of N and the clock frequency.

12. The method of claim 11, wherein adding the jitter of the controlled characteristic to the clock signal further comprises:
   generating a control signal as a function of the clock harmonic; and
   adding the jitter according to the control signal to the first clock signal to generate the second clock signal.

13. The method of claim 11, wherein adding the jitter of the controlled characteristic to the first clock signal further comprises:
   adding the variable delay to the first clock signal to generate the second clock signal.

14. The method of claim 13, wherein adding the variable delay to the first clock signal further comprises:
   delaying the first clock signal via a delay chain of multiple delay elements.

15. The method of claim 14, further comprising:
   varying a selection of one of the delay elements to output the second clock.

16. The method of claim 15, further comprising:
   generating a sequence of selection codes to control the selection of the delay elements.

17. The method of claim 16, further comprising:
   generating the sequence of the selection codes to vary the selection of the delay elements in a random manner.

18. The method of claim 14, further comprising:
   calibrating an additional amount of delay added by each delay element to suppress the clock harmonic.

19. The method of claim 11, wherein adding the jitter of a controlled characteristic to the first clock signal to generate the second clock signal further comprises:
   adding the jitter of the controlled characteristic to convert a power at the clock harmonic to the spurs.

20. The method of claim 11, adding the jitter of a controlled characteristic to the first clock signal to generate the second clock signal further comprises:
   adding the jitter of the controlled characteristic to convert a power at the clock harmonic to a noise floor.

\* \* \* \* \*